United States Patent
Lan et al.

(10) Patent No.: US 12,025,670 B2
(45) Date of Patent: Jul. 2, 2024

(54) BATTERY CONTROL DEVICE FOR DETERMINING REMAINING BATTERY POWER INFORMATION AND BATTERY CAPACITY ESTIMATION METHOD

(71) Applicants: Chi-Ming Lan, Taipei (TW); Kuo-Kuei Hsu, Taipei (TW); Chia-Chang Chen, Taipei (TW)

(72) Inventors: Chi-Ming Lan, Taipei (TW); Kuo-Kuei Hsu, Taipei (TW); Chia-Chang Chen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 538 days.

(21) Appl. No.: 17/335,068

(22) Filed: May 31, 2021

(65) Prior Publication Data

US 2021/0405124 A1 Dec. 30, 2021

(30) Foreign Application Priority Data

Jun. 24, 2020 (TW) .................................. 109121469

(51) Int. Cl.
G01R 31/3842 (2019.01)
G01R 31/374 (2019.01)
G01R 31/3835 (2019.01)
G01R 31/392 (2019.01)
H01M 10/48 (2006.01)

(52) U.S. Cl.
CPC ....... *G01R 31/3842* (2019.01); *G01R 31/374* (2019.01); *G01R 31/3835* (2019.01); *G01R 31/392* (2019.01); *H01M 10/486* (2013.01)

(58) Field of Classification Search
CPC .................................................. G01R 31/3842
USPC .......................................................... 320/132
See application file for complete search history.

(56) References Cited

U.S. PATENT DOCUMENTS

| 2015/0032394 | A1* | 1/2015 | Kimura | G01R 31/367 |
| | | | | 702/63 |
| 2015/0241516 | A1 | 8/2015 | Hotta | |
| 2016/0209472 | A1* | 7/2016 | Chow | B60K 37/02 |
| 2017/0176544 | A1* | 6/2017 | Shimizu | G01R 31/392 |
| 2019/0036356 | A1* | 1/2019 | Subbaraman | H01M 10/488 |

FOREIGN PATENT DOCUMENTS

| CN | 108182016 | 6/2018 |
| TW | I299589 | 8/2008 |

* cited by examiner

*Primary Examiner* — Yalkew Fantu
(74) *Attorney, Agent, or Firm* — JCIPRNET

(57) ABSTRACT

A battery control device and a battery capacity estimation method are provided. The battery control device includes a current detector and a processor. The current detector detects the battery. The processor is electrically connected to the current detector. The processor performs coulomb current integration to obtain the integrated value based on a current detection result of the battery detected by the current detector during a sampling period. The processor multiplies the integrated value by a battery coulomb beta coefficient to obtain a depth of discharge. The processor calculates a first relative state-of-charge of the battery according to the depth of discharge and determines remaining battery power information according to the first relative state-of-charge.

18 Claims, 4 Drawing Sheets

BATTERY CONTROL DEVICE FOR DETERMINING REMAINING BATTERY POWER INFORMATION AND BATTERY CAPACITY ESTIMATION METHOD

CROSS-REFERENCE TO RELATED APPLICATION

This application claims the priority benefit of Taiwan application serial no. 109121469, filed on Jun. 24, 2020. The entirety of the above-mentioned patent application is hereby incorporated by reference herein and made a part of this specification.

BACKGROUND

Technical Field

The disclosure relates to a device and an estimation method, and in particular to a battery control device and a battery capacity estimation method.

Description of Related Art

In a conventional battery capacity estimation, the remaining battery power of a battery is usually determined only by the fixed discharge current and the discharge time of the battery. However, the remaining battery power of the battery may also be affected by factors such as different battery temperatures or different discharge currents. Moreover, the battery temperature and the discharge current of the battery may change with time. Therefore, when the discharge current of the battery changes or the temperature of the battery changes, an estimation error is generated in the conventional battery capacity estimation, and it is impossible to provide an accurate battery capacity estimation. In view of this, several embodiments are proposed as solutions.

SUMMARY

The disclosure provides a battery control device and a battery capacity estimation method capable of estimating the battery capacity in an effective manner.

The battery control device of the disclosure is adapted to control a battery and electrically connected to the battery. The battery control device includes a current detector and a processor. The current detector is adapted to detect the battery. The processor is electrically connected to the current detector. The processor performs coulomb current integration to obtain an integrated value based on a current detection result of the battery detected by the current detector during a sampling period. The processor multiplies the integrated value by a battery coulomb beta coefficient to obtain a depth of discharge. The processor calculates a first relative state-of-charge of the battery according to the depth of discharge and determines remaining battery power information according to the first relative state-of-charge.

The battery capacity estimation method of the disclosure includes performing coulomb current integration to obtain an integrated value based on a current detection result of a battery detected by a current detector during a sampling period, multiplying the integrated value by a battery coulomb beta coefficient to obtain a depth of discharge, calculating a first relative state-of-charge of the battery according to the depth of discharge, and determining remaining battery power information according to the first relative state-of-charge.

Based on the above, the battery control device and battery capacity estimation method of the disclosure estimate the battery capacity in an effective manner by multiplying the integrated value generated by the coulomb current integration by the battery coulomb beta coefficient.

In order to make the aforementioned features and advantages of the disclosure comprehensible, embodiments accompanied with drawings are described in detail below.

DESCRIPTION OF THE EMBODIMENTS

Figure 1:
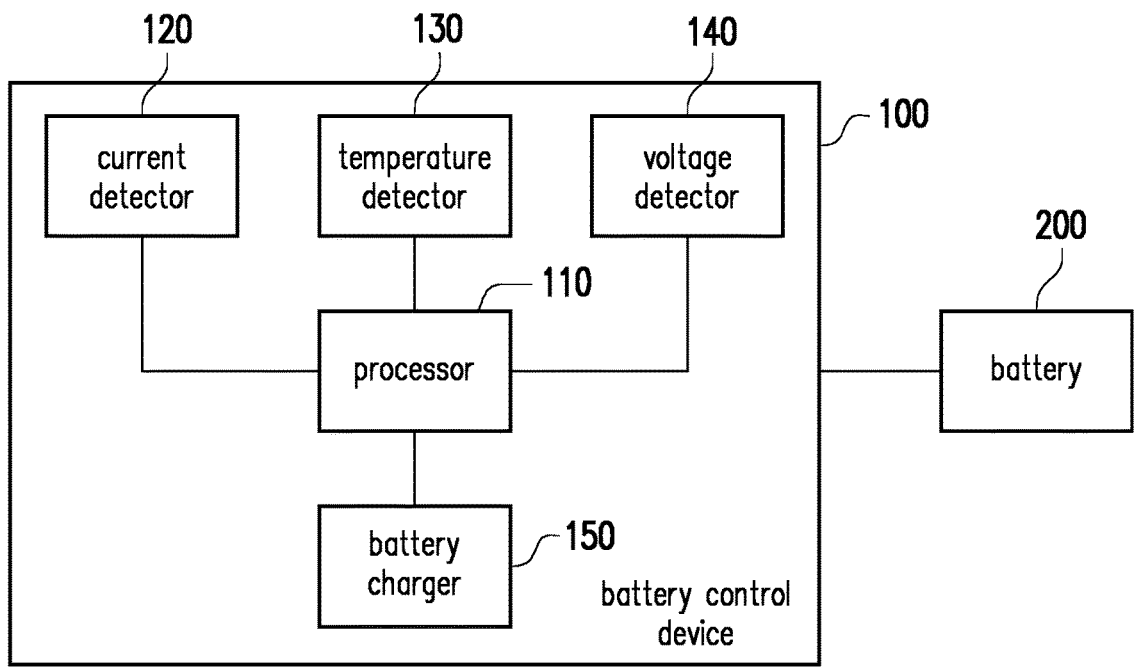
FIG. 1 is a schematic view of a battery control device according to an embodiment of the disclosure.

In order to make the content of the disclosure easier to understand, the following specific embodiments are taken as examples in which the disclosure can indeed be implemented. In addition, wherever possible, elements/components/steps using the same reference numerals in the drawings and embodiments represent the same or similar components.

FIG. 1 is a schematic view of a battery control device according to an embodiment of the disclosure. Referring to FIG. 1, a battery control device 100 includes a processor 110, a current detector 120, a temperature detector 130, a voltage detector 140, and a battery charger 150. The battery control device 100 is electrically connected to a battery 200 and is adapted to control the charging and discharging of the battery 200 and to detect the battery capacity of the battery 200. In the embodiment, the battery 200 may be a chemical battery, and the battery 200 may be a rechargeable battery or a non-rechargeable battery. In an embodiment, if the battery 200 is a non-rechargeable battery, the battery control device 100 may not include the battery charger 150. In the embodiment, the current detector 120 is electrically connected to the battery 200 to detect the current output from the battery 200 to a load. The temperature detector 130 is, for example, disposed in the battery 200 or attached to a surface of the battery 200 to detect the battery temperature of the battery 200. The voltage detector 140 is electrically connected to the battery 200 to detect a load voltage output by the battery 200. The battery charger 150 is electrically connected to the battery 200 to determine whether to charge the battery 200 according to a control signal output by the processor 110.

In the embodiment, the processor 110 may implement calculations such as the following formulas (1) and (2) to obtain a depth of discharge (DoD) of the battery 200 and then convert the depth of discharge into a first relative state-of-charge (RSOC). In detail, as in formula (1), the processor 110 may perform coulomb current integration to obtain an integrated value (∫I×(Δt) based on the current detection result of the battery 200 detected by the current detector 120 during a sampling period (Δt), and the processor 110 multiplies the integrated value by the battery coulomb beta coefficient (β) to obtain the depth of discharge (DoD). Then, as in formula (2), the processor 110 may calculate the first relative state-of-charge (RSOC_1) of the battery 200 according to the depth of discharge (DoD). Therefore, the processor 110 may determine the remaining battery power information of the battery 200 according to the first relative state-of-charge (RSOC_1). In an embodiment, the processor 110 may display the remaining battery power information of the battery 200 through a display device. Moreover, the processor 110 may determine whether to control the battery charger 150 to charge the battery 200 according to the remaining battery power information.

$$DoD = \int I \times (\Delta t) \times \beta \quad \text{Formula (1)}$$

$$RSOC\_1 = 100\% - DoD \quad \text{Formula (2)}$$

Figure 2:
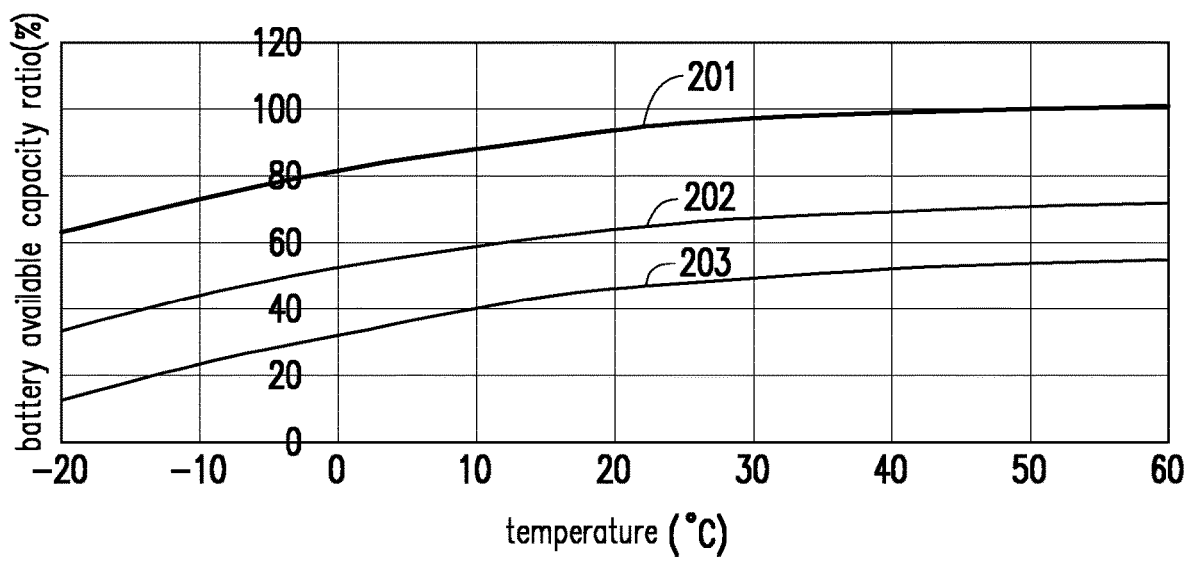
FIG. 2 is a graph showing changes between a battery available capacity ratio and a temperature according to an embodiment of the disclosure.
Figure 3:
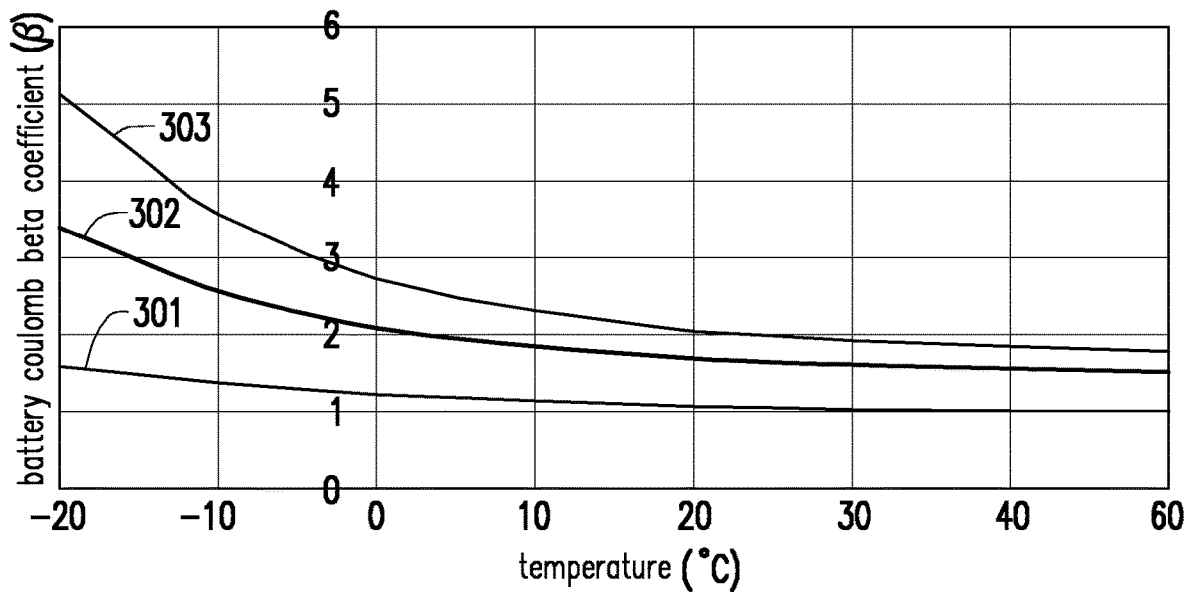
FIG. 3 is a graph showing changes between a battery coulomb beta coefficient and a temperature according to an embodiment of the disclosure.

FIG. 2 is a graph showing changes between a battery available capacity ratio and a temperature according to an embodiment of the disclosure. FIG. 3 is a graph showing changes between a battery coulomb beta coefficient and a temperature according to an embodiment of the disclosure. Referring first to FIG. 1 and FIG. 2, for example, the relationship between the battery available capacity ratio (%) of the battery 200 and the temperature (° C.) changes as characteristic curves 201, 202, and 203 shown in FIG. 2. In FIG. 2, the characteristic curve 201 may, for example, indicate that the battery available capacity ratio of the battery 200 decreases as the temperature decreases when the current of the battery 200 is 0 amperes (A) (in an idle state). The characteristic curve 202 may, for example, indicate that the battery available capacity ratio of the battery 200 decreases as the temperature decreases when the current (the charge current or the discharge current) of the battery 200 is 6.93 A. The characteristic curve 203 may, for example, indicate that the battery available capacity ratio of the battery 200 decreases as the temperature decreases when the current (the charge current or the discharge current) of the battery 200 is 28 A. In other words, the battery available capacity ratio of the battery 200 is proportional to the temperature of the battery 200, and the battery available capacity ratio of the battery 200 is inversely proportional to the charge current or the discharge current of the battery 200.

Referring to FIG. 1 and FIG. 3, the battery coulomb beta coefficient (β) of the embodiment is the reciprocal of the battery available capacity ratio. For example, the relationship between the battery coulomb beta coefficient (β) and the temperature (° C.) of the battery 200 changes as characteristic curves 301, 302, and 303 shown in FIG. 3. In FIG. 3, the characteristic curve 301 may, for example, indicate that the battery coulomb beta coefficient (β) of the battery 200 decreases as the temperature increases when the current of the battery 200 is 0 amperes (A) (in an idle state). The characteristic curve 302 may, for example, indicate that the battery coulomb beta coefficient (β) of the battery 200 decreases as the temperature increases when the current (the charge current or the discharge current) of the battery 200 is 10 A. The characteristic curve 303 may, for example, indicate that the battery coulomb beta coefficient (β) of the battery 200 decreases as the temperature increases when the current (the charge current or the discharge current) of the battery 200 is 19 A. In other words, the battery coulomb beta coefficient (β) of the battery 200 is inversely proportional to the temperature of the battery 200, and the battery coulomb beta coefficient (β) of the battery 200 is proportional to the charge current or the discharge current of the battery 200.

In the embodiment, the battery control device 100 of FIG. 1 may, for example, pre-establish a first look-up table (LUT) as the following Table 1 according to the characteristic curves in FIG. 2 and FIG. 3. In the Table 1, different temperatures and different currents of the battery may respectively correspond to a specific battery coulomb beta coefficient (β). That is, in the embodiment, when the processor 110 calculates the remaining battery power information, the temperature of the battery 200 may be detected by the temperature detector 130. Moreover, the processor 110 queries the first look-up table as shown in the Table 1 according to the current of the battery 200 detected by the current detector 120 and the temperature of the battery 200 to obtain the corresponding battery coulomb beta coefficient. Next, the processor 110 multiplies the coulomb current integration result (∫I×(Δt)) by the battery coulomb beta coefficient (β) to obtain the depth of discharge (DoD) and converts the depth of discharge (DoD) to the first relative state-of-charge (RSOC_1). Therefore, the battery control device 100 of the embodiment is capable of estimating the remaining battery power information of the battery 200 in an effective manner according to the changes of the temperature and the charge current or the discharge current of the battery. In addition, the battery coulomb beta coefficient (β) of the disclosure is not limited to the Table 1. The Table 1 is only used as an example in the embodiment to illustrate the relationship of the battery coulomb beta coefficient (β) with respect to the temperature and the current of the battery.

TABLE 1

| | Temperature (° C.) | | | |
|---|---|---|---|---|
| | 50° C. | 25° C. | 0° C. | −20° C. |
| | Coefficient | Coefficient | Coefficient | Coefficient |
| Current (A) | (β) | (β) | (β) | (β) |
| 0.00 | 1 | 1.0415783 | 1.219101 | 1.583942 |
| 1.40 | 1.049056 | 1.101508 | 1.295892 | 1.721107 |
| 2.66 | 1.110216 | 1.175108 | 1.408485 | 1.960348 |
| 2.80 | 1.117454 | 1.183897 | 1.422214 | 1.9911 |
| 4.77 | 1.23945 | 1.323495 | 1.615495 | 2.368217 |
| 6.93 | 1.40799 | 1.52001 | 1.848366 | 2.788921 |
| 7.00 | 1.414222 | 1.52736 | 1.8592 | 2.814526 |
| 10.00 | 1.505224 | 1.636339 | 2.086612 | 3.386165 |

Figure 4:
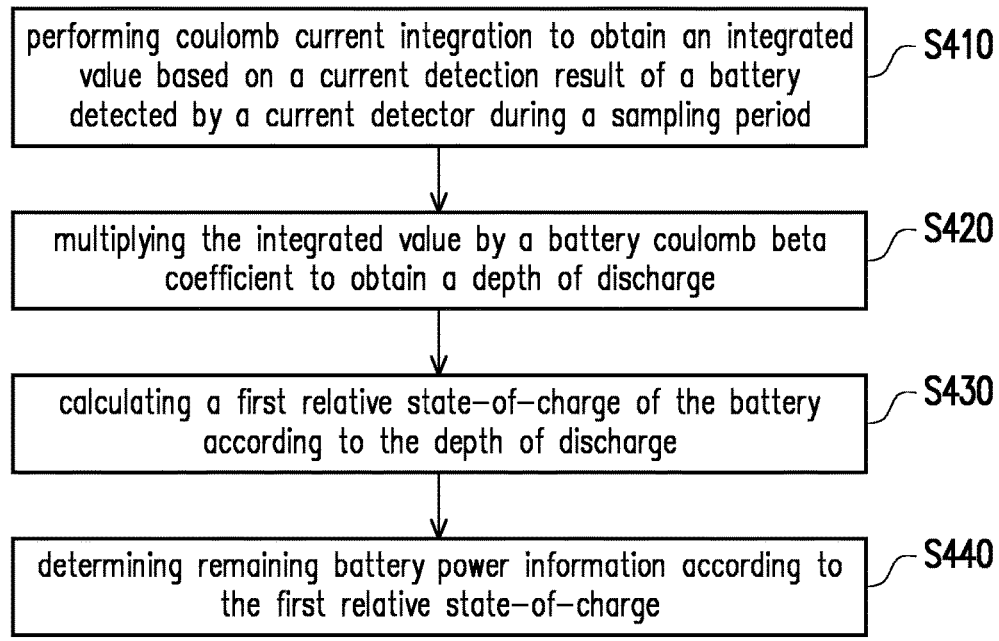
FIG. 4 is a flowchart of a battery capacity estimation method according to an embodiment of the disclosure.

FIG. 4 is a flowchart of a battery capacity estimation method according to an embodiment of the disclosure. Referring to FIG. 4, the battery capacity estimation method of FIG. 4 may be at least adapted to the battery control device 100 of the embodiment in FIG. 1. In a step S410, the processor 110 of the battery control device 100 may perform the coulomb current integration to obtain the integrated value based on the current detection result of the battery 200 detected by the current detector 120 during the sampling period. In a step S420, the processor 110 may multiply the integrated value by the battery coulomb beta coefficient to obtain the depth of discharge. In a step S430, the processor 110 may calculate the first relative state-of-charge of the battery according to the depth of discharge. In a step S440, the processor 110 may determine the remaining battery power information according to the first relative state-of-charge. Therefore, the battery capacity estimation method of the embodiment is capable of estimating the remaining battery power information of the battery 200 in an effective manner. In addition, regarding the battery control device 100 of the embodiment and the related calculation methods, reference may be made to the descriptions of the embodiments in FIG. 1 to FIG. 3 to obtain sufficient teaching, suggestions, and implementation descriptions, so the details thereof are omitted.

Referring to FIG. 1 again, in some embodiments of the disclosure, the battery control device 100 may further obtain a second relative state-of-charge by a real-time open circuit voltage of the battery 200, and the second relative state-of-charge is adopted to update the remaining battery power information of the battery 200. The real-time open circuit voltage of the battery 200 changes with time. Specifically, the processor 110 may detect the load voltage of the battery 200 in real time through the voltage detector 140 and may obtain the real-time open circuit voltage of the battery 200 according to the load voltage. Note that the processor 110 may, for example, pre-establish a second look-up table as the following Table 2. The second look-up table in the embodiment may be, for example, a look-up table established based on the actual relative state-of-charge (the second relative state-of-charge) of the battery 200 which is actually detected based on different currents, different battery temperatures, and different open circuit voltages with different battery factors such as battery aging or other battery factors.

In the Table 2, different currents and different temperatures of the battery 200 may correspond to different open circuit voltages respectively under different second relative state-of-charges. In other words, when continuously calculating the real-time open circuit voltage, the processor 110 simultaneously obtains the real-time current value and the real-time temperature by the current detector 120 and the temperature detector 130. When the processor 110 determines that the second relative state-of-charge corresponding to the real-time open circuit voltage in the second look-up table is different from the first relative state-of-charge, the processor 110 may update the first relative state-of-charge (RSOC_1) to the second relative state-of-charge (RSOC_2) to update the remaining battery power information of the battery 200.

charge (RSOC_1) to the second relative state-of-charge (RSOC_2) so as to update the remaining battery power information of the battery 200. Moreover, after the processor 110 updates the first relative state-of-charge (RSOC_1) to the second relative state-of-charge (RSOC_2), the processor 110 may calculate a new depth of discharge based on the second relative state-of-charge (RSOC_2) and continues to perform the coulomb current integration with the new depth of discharge to continue to update the remaining battery power information. In other words, the processor 110 of the embodiment may calibrate the remaining battery power information with respect to the battery aging in real time. However, in some embodiments of the disclosure, the processor 110 may also compare the first relative state-of-charge (RSOC_1) with the second relative state-of-charge (RSOC_2) when the second relative state-of-charge (RSOC_2) corresponding to the calculated real-time open circuit voltage is 0% and may update the remaining battery power information so as to prevent the processor 110 from erroneously determining that the battery 200 has remaining power when the battery 200 has been exhausted because the first relative state-of-charge (RSOC_1) has not been reset to zero.

In addition, note that the second look-up table of the disclosure is not limited to the Table 2. In some embodiments of the disclosure, the processor 110 may also establish look-up tables with different open circuit voltages respectively corresponding to more different temperatures and more different currents of the battery under different second relative state-of-charges, e.g., ranging from 0% to 100%, through multiple times of actual measurement or interpolation. Moreover, based on the above description, the battery control device 100 of the embodiment may perform the procedures illustrated in FIG. 5 to update the remaining battery power information.

Figure 5:
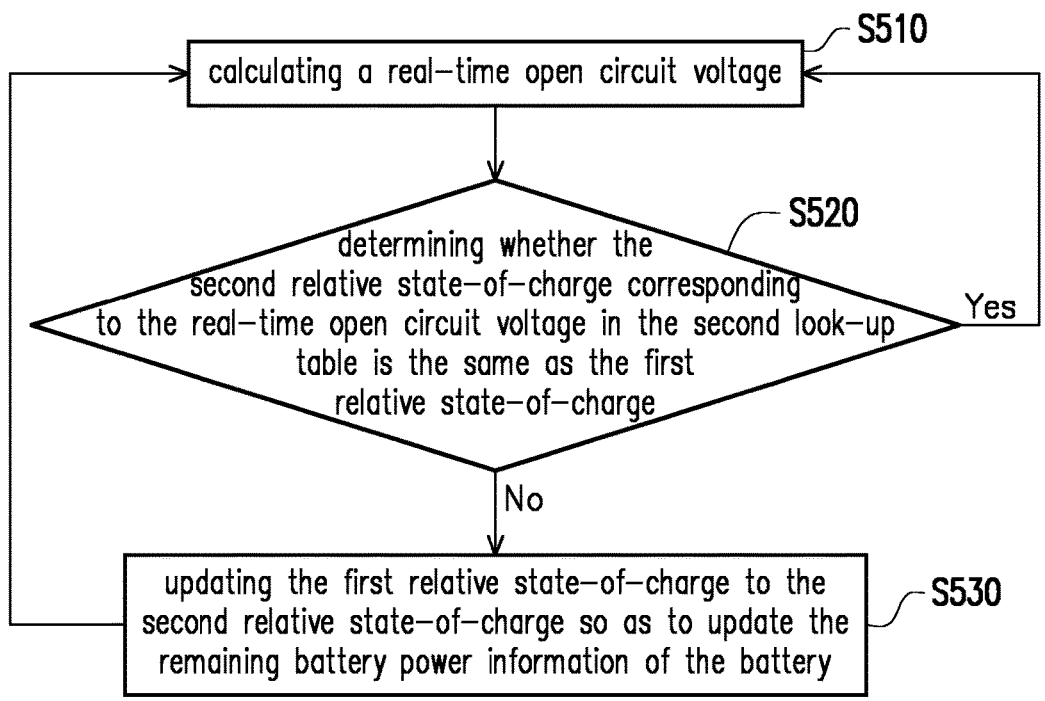
FIG. 5 is a flowchart of updating remaining battery power information according to an embodiment of the disclosure.

FIG. 5 is a flowchart of updating remaining battery power information according to an embodiment of the disclosure. Referring to FIG. 1 and FIG. 5, in a step S510, the processor

TABLE 2

| | | Open circuit voltage (V) | | | |
| --- | --- | --- | --- | --- | --- |
| Temperature (° C.) | RSOC_2 | Current (A) 10 A | Current (A) 6 A | Current (A) 3 A | Current (A) 0 A |
| 50° C. | 41% | 12.1345 (V) | 12.09(V) | 12.1 (V) | 12.1 (V) |
| 50° C. | 0% | 11.2 (V) | 11.08(V) | 10.99 (V) | 10.69 (V) |
| 25° C. | 41% | 12.08 (V) | 12.07(V) | 12.04 (V) | 11.995 (V) |
| 25° C. | 0% | 11.13 (V) | 11.09(V) | 10.89 (V) | 10.605 (V) |
| 0° C. | 41% | 12.04 (V) | 12.08(V) | 12.03 (V) | 11.925 (V) |
| 0° C. | 0% | 11.24 (V) | 11.17(V) | 10.99 (V) | 10.78 (V) |
| −20° C. | 41% | 11.95 (V) | 11.98(V) | 12.08 (V) | 12.14 (V) |
| −20° C. | 0% | 11.58 (V) | 11.68(V) | 11.71 (V) | 11.725 (V) |

For example, assuming that the real-time charge current or the discharge current of the battery 200 is 6 A, and the real-time temperature of the battery 200 is 25° C., when the open circuit voltage calculated by the processor 110 in real time is 12.07 (V), the processor 110 may obtain the second relative state-of-charge (RSOC_2) corresponding to the real-time open circuit voltage, which is 41%, through the second look-up table as the Table 2. Therefore, if the first relative state-of-charge (e.g., RSOC_1=50%) calculated by the processor 110 according to the embodiment of FIG. 4 and the second relative state-of-charge (e.g., RSOC_2=41%) are different, this means that the battery 200 may be aged, and the actual relative state-of-charge may be 41%. Therefore, the processor 110 may update the first relative state-of- 110 may calculate the real-time open circuit voltage. In a step S520, the processor 110 may determine whether the second relative state-of-charge corresponding to the real-time open circuit voltage in the second look-up table is the same as the first relative state-of-charge. If so, the processor 110 re-performs the step S510 to calculate the open circuit voltage of the battery 200 at the next time point. If not, the processor 110 performs a step S530. In the step S530, the processor 110 updates the first relative state-of-charge to the second relative state-of-charge so as to update the remaining battery power information of the battery 200. Moreover, the processor 110 may re-perform the step S510 to continue to calculate the open circuit voltage of the battery 200 at the next time point. Note that the calculation method of the real-time open circuit voltage in the embodiment is described in detail in an embodiment in FIG. 7.

Figure 6:
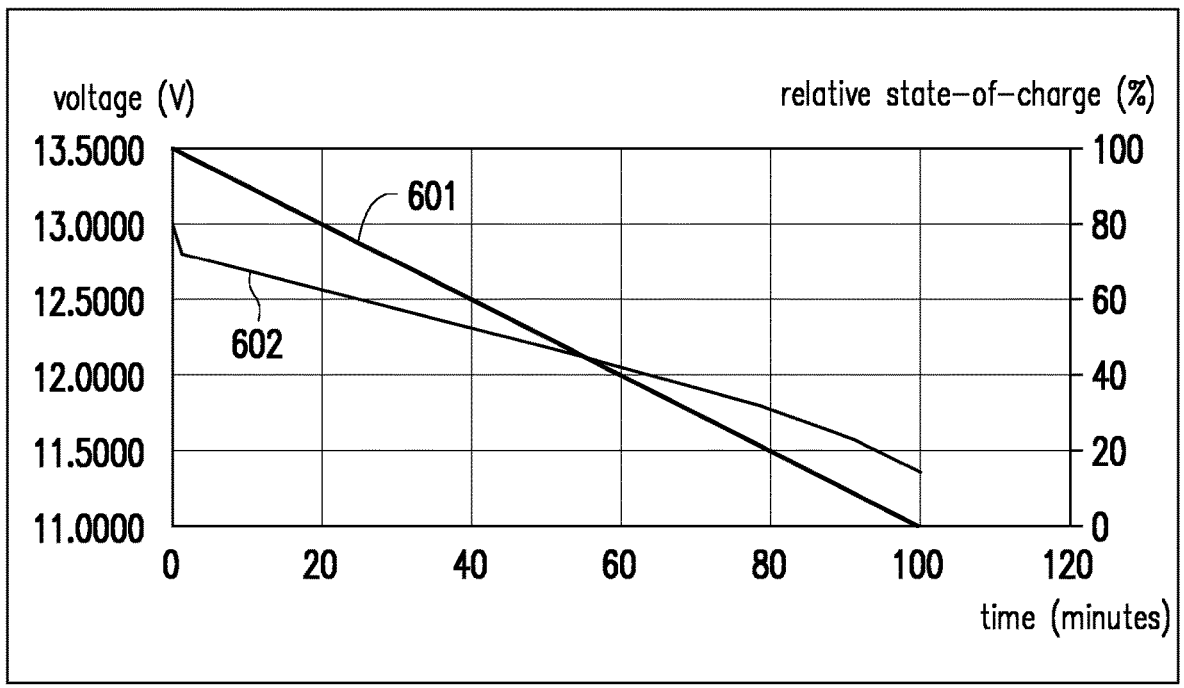
FIG. 6 is a graph showing the relationship between a first relative state-of-charge and a second relative state-of-charge according to an embodiment of the disclosure.

For example, FIG. 6 is a graph showing the relationship between a first relative state-of-charge and a second relative state-of-charge according to an embodiment of the disclosure. With reference to FIG. 6, a characteristic curve 601 of FIG. 6 may, for example, represent a first relative state-of-charge that changes with time, and a characteristic curve 602 may, for example, represent a second relative state-of-charge that changes with time. The characteristic curve 602 can be pre-established. As shown in FIG. 6, it is assumed that the battery 200 is in a discharging state, so the first relative state-of-charge decreases with time. However, since the open circuit voltage of the battery 200 also decreases with time, in consideration of the change in the open circuit voltage, the actual relative state-of-charge of the battery 200 may change with time as the characteristic curve 602. In other words, the processor 110 may compare the first relative state-of-charge with the second relative state-of-charge at a predetermined determination period or when detecting a specific state-of-charge or a specific open circuit voltage as shown in the Table 2.

As shown in FIG. 6, for example, when the battery 200 continues to discharge for 80 minutes, the processor 110 may calculate the first relative state-of-charge as 30% with the method in FIG. 1 to FIG. 4, but the processor 110 calculates the second relative state-of-charge as 20% with the open circuit voltage. In other words, the actual battery capacity of the battery 200 is 20% after 80 minutes of continuous discharge, so the processor 110 immediately updates the remaining battery power information from the 30% of the first relative state-of-charge to the 20% of the second relative state-of-charge. Moreover, the processor 110 then continues to perform the coulomb current integration based on the correct depth of discharge of the battery 200 corresponding to the relative state-of-charge of 20%, so that the subsequent updated remaining battery power information may be correctly updated.

Figure 7:
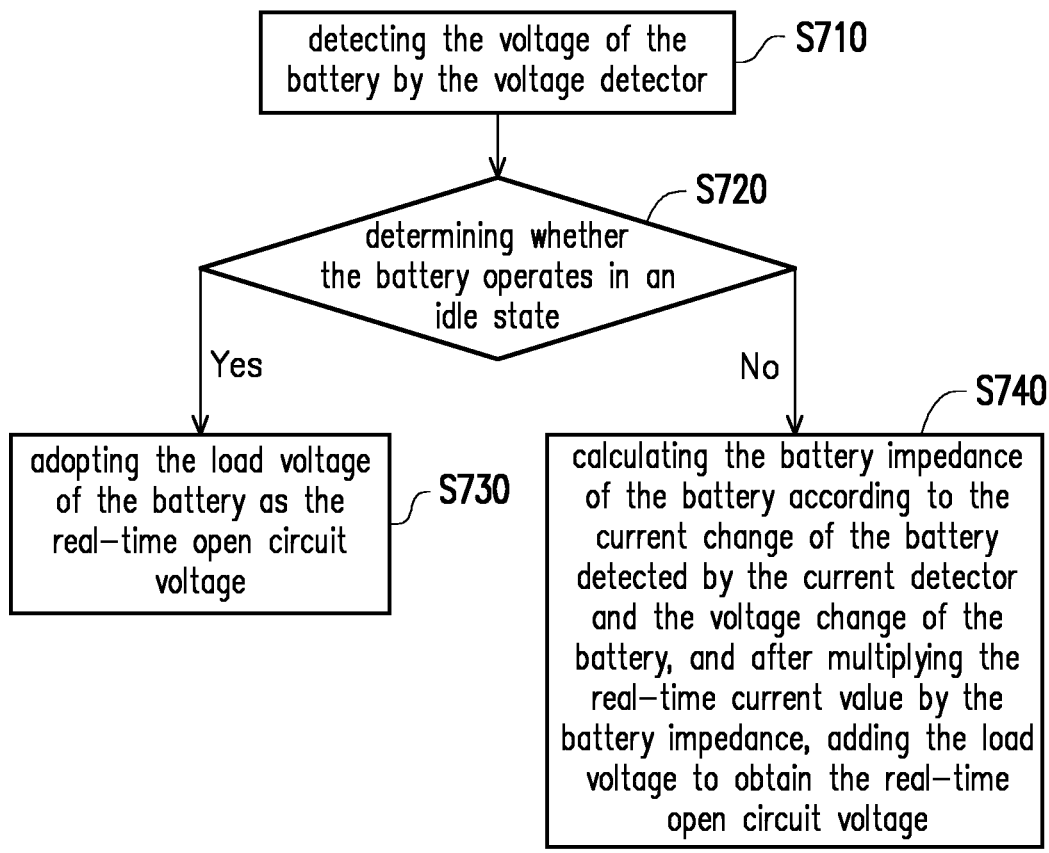
FIG. 7 is a flowchart of calculating an open circuit voltage according to an embodiment of the disclosure.

FIG. 7 is a flowchart of calculating an open circuit voltage according to an embodiment of the disclosure. Referring to FIG. 1 and FIG. 7, the processor 110 may calculate the open circuit voltage in the embodiment of FIG. 6 according to steps S710-S740 of the embodiment. In the step S710, the processor 110 detects the voltage of the battery 200 by the voltage detector 140. In the step S720, the processor 110 determines whether the battery 200 operates in an idle state, for example not being charged or discharged, or not in a state of large power consumption. If so, the processor 110 performs the step S730. In the step S730, the processor 110 adopts the load voltage of the battery 200 as the real-time open circuit voltage. If not, the processor 110 performs the step S740, which is explained with the following formulas (3) and (4). The processor 110 may, for example, implement the calculation of the formula (3) to obtain a battery impedance (R), and for example implement the calculation of the formula (4) to obtain the real-time open circuit voltage (Voc_now). The battery impedance (R) is an internal resistance of the battery 200. Therefore, in the step S740, the processor 110 calculates the battery impedance (R) of the battery 200 according to the current change (ΔI) and the voltage change (ΔV) of the battery 200 detected by the current detector 120 and the voltage detector 140, and after multiplying the real-time current value (I) by the battery impedance (R), the processor 110 adds the load voltage (V_load) to obtain the real-time open circuit voltage (Voc_now).

$$R = \frac{\Delta V}{\Delta I} \qquad \text{Formula (3)}$$

$$\text{Voc\_now} = I \times R + \text{V\_load} \qquad \text{Formula (4)}$$

Therefore, by the procedures of calculating the open circuit voltage in the embodiment, the real-time open circuit voltage of the battery 200 in the idle state or in the non-idle state may be obtained in an effective manner. Moreover, in some embodiments of the disclosure, since the battery impedance (R) obtained by the processor 110 in the step S740 is the internal resistance of the battery 200, the processor 110 is also capable of evaluating the battery aging of the battery 200 according to the impedance change result of the calculated battery impedance (R) at different time points.

Base on the above, the battery control device and the battery capacity estimation method of the disclosure are capable of obtaining a first relative state-of-charge to estimate the remaining battery power information of the battery in an effective manner by performing coulomb current integration and pre-establishing a look-up table that takes into account the battery coulomb beta coefficient affected by the temperature and the charge current or the discharge current of the battery. In addition, the battery control device and the battery capacity estimation method of the disclosure may further pre-establish a second relative state-of-charge regarding the open circuit voltage of the battery to calibrate the remaining battery power information estimated based on the first relative state-of-charge, and the influence of battery aging or other battery factors may be further taken into account in the estimation of the remaining battery power information of the battery so that an accurate battery capacity estimation function is provided.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A battery control device, adapted to control a battery and electrically connected to the battery, wherein the battery control device comprises:
   a current detector adapted to detect the battery; and
   a processor electrically connected to the current detector, wherein the processor performs coulomb current integration to obtain an integrated value based on a current detection result of the battery detected by the current detector during a sampling period, and the processor multiplies the integrated value by a battery coulomb beta coefficient to obtain a depth of discharge, and
   wherein the processor calculates a first relative state-of-charge of the battery according to the depth of discharge and determines remaining battery power information according to the first relative state-of-charge,
   wherein when the processor determines that a second relative state-of-charge corresponding to a real-time open circuit voltage in a second look-up table is different from the first relative state-of-charge, the processor updates the first relative state-of-charge to the second relative state-of-charge so as to update the remaining battery power information.

2. The battery control device according to claim 1, further comprising:
a temperature detector electrically connected to the processor and adapted to detect a temperature of the battery,
wherein the processor queries a first look-up table to obtain the battery coulomb beta coefficient according to a current value of the battery detected by the current detector and the temperature of the battery.

3. The battery control device according to claim 2, wherein the battery coulomb beta coefficient is a reciprocal of a battery available capacity ratio, and the battery available capacity ratio is proportional to the temperature of the battery.

4. The battery control device according to claim 1, wherein after the processor updates the first relative state-of-charge to the second relative state-of-charge, the processor calculates a new depth of discharge based on the second relative state-of-charge and continues to perform the coulomb current integration with the new depth of discharge so as to continue to update the remaining battery power information.

5. The battery control device according to claim 1, wherein the second relative state-of-charge is 41% or 0%.

6. The battery control device according to claim 1, further comprising:
a voltage detector electrically connected to the processor and adapted to detect the battery,
wherein the processor determines the real-time open circuit voltage according to a load voltage of the battery.

7. The battery control device according to claim 6, wherein when the battery operates in an idle state, the processor adopts the load voltage as the real-time open circuit voltage, and
when the battery operates in a non-idle state, the processor calculates a battery impedance of the battery according to a current change of the battery detected by the current detector and a voltage change of the battery, and after multiplying a real-time current value by the battery impedance, the processor adds the load voltage to obtain the real-time open circuit voltage.

8. The battery control device according to claim 7, wherein the processor determines battery aging of the battery according to the battery impedance.

9. The battery control device according to claim 1, further comprising:
a battery charger electrically connected to the processor,
wherein the processor determines whether the battery is to be charged by the battery charger according to the remaining battery power information.

10. A battery capacity estimation method, comprising:
performing coulomb current integration to obtain an integrated value based on a current detection result of a battery detected by a current detector during a sampling period;
multiplying the integrated value by a battery coulomb beta coefficient to obtain a depth of discharge;
calculating a first relative state-of-charge of the battery according to the depth of discharge; and
determining remaining battery power information according to the first relative state-of-charge,
when determining that a second relative state-of-charge corresponding to a real-time open circuit voltage in a second look-up table is different from the first relative state-of-charge, updating the first relative state-of-charge to the second relative state-of-charge so as to update the remaining battery power information.

11. The battery capacity estimation method according to claim 10, wherein in multiplying the integrated value by the battery coulomb beta coefficient to obtain the depth of discharge, the battery capacity estimation method comprises:
detecting a temperature of the battery by a temperature detector; and
querying a first look-up table to obtain the battery coulomb beta coefficient according to a current value of the battery detected by the current detector and the temperature of the battery.

12. The battery capacity estimation method according to claim 11, wherein the battery coulomb beta coefficient is a reciprocal of a battery available capacity ratio, and the battery available capacity ratio is proportional to the temperature of the battery.

13. The battery capacity estimation method according to claim 10, further comprising:
calculating a new depth of discharge based on the second relative state-of-charge and continuing to perform the coulomb current integration with the new depth of discharge so as to continue to update the remaining battery power information after updating the first relative state-of-charge to the second relative state-of-charge.

14. The battery capacity estimation method according to claim 10, wherein the second relative state-of-charge is 41% or 0%.

15. The battery capacity estimation method according to claim 10, further comprising:
detecting the battery by a voltage detector; and
determining the real-time open circuit voltage according to a load voltage of the battery.

16. The battery capacity estimation method according to claim 15, wherein in determining the real-time open circuit voltage according to the load voltage, the battery capacity estimation method further comprises:
adopting the load voltage as the real-time open circuit voltage when the battery operates in an idle state; and
calculating a battery impedance of the battery according to a current change of the battery detected by the current detector and a voltage change of the battery when the battery operates in a non-idle state, and after multiplying a real-time current value by the battery impedance, adding the load voltage to obtain the real-time open circuit voltage.

17. The battery capacity estimation method according to claim 16, further comprising:
determining battery aging of the battery according to the battery impedance.

18. The battery capacity estimation method according to claim 10, further comprising:
determining whether the battery is to be charged by a battery charger according to the remaining battery power information.

* * * * *